US012563761B2

(12) United States Patent
Subramanian et al.

(10) Patent No.: US 12,563,761 B2
(45) Date of Patent: Feb. 24, 2026

(54) VERTICALLY STACKED TRANSISTOR STRUCTURES

(71) Applicant: IMEC VZW, Leuven (BE)

(72) Inventors: Sujith Subramanian, Leuven (BE); Hans Mertens, Leuven (BE); Steven Demuynck, Aarschot (BE)

(73) Assignee: IMEC VZW, Leuven (BE)

( * ) Notice: Subject to any disclaimer, the term of this patent is extended or adjusted under 35 U.S.C. 154(b) by 427 days.

(21) Appl. No.: 18/063,859

(22) Filed: Dec. 9, 2022

(65) Prior Publication Data

US 2023/0187539 A1    Jun. 15, 2023

(30) Foreign Application Priority Data

Dec. 15, 2021    (EP) ..................................... 21214857

(51) Int. Cl.
*H10D 30/01*        (2025.01)
*H10D 62/17*        (2025.01)
*H10D 64/01*        (2025.01)
(52) U.S. Cl.
CPC ......... *H10D 30/024* (2025.01); *H10D 62/235* (2025.01); *H10D 64/017* (2025.01)
(58) Field of Classification Search
CPC .... H10D 30/024; H10D 30/014; H10D 30/43; H10D 30/62; H10D 30/6735; H10D 62/121; H10D 84/0165; H10D 84/856
See application file for complete search history.

(56) References Cited

U.S. PATENT DOCUMENTS

| | | | |
|---|---|---|---|
| 2017/0213821 A1* | 7/2017 | Or-Bach | ................ H10D 84/85 |
| 2021/0202500 A1* | 7/2021 | Chanemougame | .... H10D 89/10 |
| 2022/0037192 A1* | 2/2022 | Yu | ........................ H01L 23/5222 |
| 2022/0037496 A1* | 2/2022 | Chen | .................... H10D 62/115 |

FOREIGN PATENT DOCUMENTS

CN          113675194 A      11/2021

OTHER PUBLICATIONS

Extended European Search Report and Written Opinion, Application No. EP21214857.1, mailed Aug. 31, 2022, 12 pages.

\* cited by examiner

*Primary Examiner* — Tuan A Hoang
(74) *Attorney, Agent, or Firm* — McDonnell Boehnen Hulbert & Berghoff LLP

(57)                    ABSTRACT

A method for forming a first transistor structure from a first channel layer and a second transistor structure from a second channel layer is disclosed. The first channel layer and the second channel layer are vertically stacked on a substrate. The method includes processing the first transistor structure from above, followed by processing the second transistor structure from the backside.

20 Claims, 7 Drawing Sheets

VERTICALLY STACKED TRANSISTOR STRUCTURES

CROSS-REFERENCE TO RELATED APPLICATIONS

The present application is a non-provisional patent application claiming priority to European Patent Application No. 21214857.1, filed on Dec. 15, 2021, the contents of which are hereby incorporated by reference.

FIELD OF THE DISCLOSURE

The present disclosure relates to semiconductor processing in general, and to processing of vertically stacked transistor structures in particular.

BACKGROUND

In the effort to provide more area-efficient circuit designs, vertically stacked semiconductor devices are being developed. One example is the so-called complementary field-effect transistor, FET, design in which two horizontal channel transistors are stacked above each other such that the horizontal channel portion of a first one of the transistors is arranged above the horizontal channel portion of the other one of the transistors.

The development of vertically stacked designs has however led to increasingly challenging and complex process flows. The aligning of the top and the bottom devices, as well as the definition of the vertical separation between the devices, have turned out to be particularly challenging. Thus, there is a need for alternative and improved techniques for providing vertically stacked transistor structures.

SUMMARY

It is a potential benefit of the present disclosure to provide an alternative and improved method for forming a first transistor structure and a second transistor structure that are vertically stacked on a substrate. Further and alternative potential benefits may be understood from the following.

According to an aspect of the present disclosure, there is provided a method for forming a first transistor structure from a first channel layer and a second transistor structure from a second channel layer, wherein the first channel layer and the second channel layer are vertically stacked on a substrate. The method comprises:

- forming, on the first channel layer, a first gate structure;
- forming, in the first channel layer, a first source/drain portion and a second source/drain portion, wherein the first and second source/drain portions are arranged on opposite sides of the gate structure;
- forming, above the first channel layer, first contact structures contacting the first gate structure and the first and second source/drain portions;
- thinning the substrate from the backside to expose the second channel layer;
- forming, on the second channel layer, a second gate structure;
- forming, in the second channel layer, a third source/drain portion and a fourth source/drain portion, wherein the third and fourth source/drain portions are arranged on opposite sides of the gate structure; and
- forming second contact structures contacting the second gate structure and the third and fourth source/drain portions from the backside.

The disclosure allows for both the first transistor structure and the second transistor structure to be formed from a stacked structure comprising the first and second channel layer. This can be contrasted to conventional techniques in which the top one of the transistor structures instead are formed by bonding a top device to the bottom device. Forming the transistor structure from a stacked structure has several potential benefits over bonding-based processes, as will be discussed in further detail in the following. One potential benefit is that the active regions of each of the transistor structures, that is, the lateral extension of both the first and the second channel layers, can be defined in a common patterning step, rather than a bonding step. Another potential benefit of the disclosure is that it allows for the vertical separation of the first and second channel layers to be determined by the configuration of the stack rather than by any bonding layer.

Hence, a separating layer may be formed between the first channel layer and the second channel layer. The separating layer, which may be a dielectric layer comprising a semiconductor oxide or a metal oxide, may for instance be formed by replacing an epitaxially grown sacrificial layer with the dielectric layer. The epitaxy process has the potential benefit of allowing for a relatively well controlled thickness of the separating layer, which also may be varied according to the specific device design. The vertical separation between the first and second transistor structures can be varied based on the choice of materials used for the channel layers and the sacrificial layer. The thickness of the separating layer may for instance be in the range of 50 nm or less.

It will further be appreciated that the separating layer may be formed in two steps, wherein a first step involves the forming of a sacrificial layer (e.g., an epitaxial layer), which in a subsequent step is replaced by the final separating layer, which may comprise a dielectric material or an insulator. The sacrificial layer may for example be formed of a semiconductor material having an etch selectivity relative to the material of the first and second channel layers to allow it to be selectively removed. Thus, the first and second channel layers may for example comprise SiGe of a first Ge content, and the sacrificial layer SiGe of a second Ge content, allowing for the sacrificial layer to be selectively replaced with a dielectric material. In further examples, the first and second channel layers may be formed of Si and the sacrificial layer of SiGe.

The first and second channel layers may be of different conductivity types. The first channel layer for instance may be of an N-dopant type and the second channel layer of a P-dopant type, or vice versa, to allow complementary devices to be formed. Thus, the first transistor structure may form an NMOS device and the second transistor a PMOS device, or vice versa.

As mentioned above, the first and second channel layers may be arranged in a stacked manner, with a separating layer arranged between the first and second channel layers. It will be understood that each of the first and second channel layers may comprise a semiconductor material, such as for example SiGe, arranged in one or several layers interleaved with another material, such as a sacrificial material or a separating layer similar to the ones discussed above.

The stack may in some examples be patterned into an elongated structure, such as a fin, by forming trenches in the stack. Thus, a fin may be formed by etching two parallel trenches through the stack. By forming a fin, the lateral extension of the first and second channel layers may be determined by the width of the fin. This allows for the first and second channel layers, and hence the first and second transistor devices, to be self-aligned to each other.

In an embodiment, the stack may be formed by providing first and second channel layers of a first semiconductor material, and a sacrificial layer of a second semiconductor material arranged between the first and second channel layer. The sacrificial layer may then be removed by a selective etching of the semiconductor material to form a cavity between the first and second channel layer. The cavity may then be filled with an insulating or dielectric material, which also may be deposited in trenches defining the fin.

In some examples, at least one of the first and second channel layers may comprise a plurality of active layers, or channel layer structures, of the first semiconductor material stacked with layers of the second semiconductor material. In this case, the layers of the second semiconductor material may be removed by the selective etching of the second semiconductor material to form cavities underneath the layers of the first semiconductor material. Those cavities may then be filled by the insulating material, such that both the channel layer structures of the channel layer as well as the separation between the first and second transistor structures are formed by the same insulating material. This may be particularly advantageous in applications wherein the first and second transistor structures are implemented in IO devices.

At least one of the first and second channel layers may for instance comprise a plurality of vertically stacked active layers, or channel layer structures, of the first semiconductor material. These structures may for instance form nanosheets or nanowires. The active layers may be separated from each other by the separating layer, which may have been formed in a replacement process similar to the one indicated above.

It will thus be appreciated that for the purpose of the present disclosure, the term "fin" generally refers to an elongated feature comprising the first and second channel layers from which the first and second transistor structures are to be formed. Each channel layer may in turn comprise one or several active layers, or semiconductor layer structures, from which a transistor device is to be formed. A channel layer may comprise a single active layer, forming e.g. a fin field-effect transistor (FinFET) device, or a plurality of active layers arranged in a stacked manner. Examples of such active layers include nanowires and nanosheets as mentioned above. Hence, the present disclosure allows for a stacked structure wherein the first transistor structure is a FinFET device and the second transistor structure a FinFET device, a nanosheet device or a nanowire device, or any other combination of FinFET, nanosheet, and nanowire devices.

The gate structures may be formed in a so-called replacement metal gate, RMG, process, understood as the forming of a dummy gate structure which is later replaced by a gate layer stack. The dummy gate structure may serve the purpose of a placeholder while the source/gate portions are processed and can be understood as a way of increasing the thermal budget during the processing. Further, the dummy gate allows for the source/drain portions to be aligned to the gate. The method may hence comprise forming a dummy gate structure on (or above) the first channel layer and replacing the dummy gate structure with the gate layer stack after the forming of the first and second source/drain portions. Similarly, a dummy gate structure may be formed on (or above) the second channel layer and replaced with a gate layer stack after the third and fourth source/drain portions have been formed. Thereafter, a gate-to-gate connection may be formed.

In some examples, a bonding layer may be formed above the first channel layer to allow a carrier wafer to be bonded to the first channel layer. The carrier wafer may be used for flipping, or turning, the substrate upside down to allow the processing to proceed from the backside of the substrate. The flipping may for example be performed after the forming of the first and second source/drain portions in the first channel layer, and before the forming of the first contact structures (and, in the case of RMG, before forming the gate layer stack). This allows for the third and fourth source/drain portions to be formed in the second channel layer before the contact layers (and gate layer stack) are formed, thereby increasing the thermal budget. In alternative examples, however, the first contact structures (and gate layer stack), as well as further back end of line, BEOL, metal layers facilitating power delivery from both sides of the wafer, may be formed prior to flipping.

It will thus be appreciated that, in the context of the present disclosure, the substrate may be described in terms of its frontside and backside, where the first transistor structure may be at least partly processed from the frontside and the second transistor structure at least partly processed from the backside. Processing "from the backside" may also be referred to as "from below," regardless of whether the substrate has been flipped or not.

In some examples, the first and second channel layers may be removed from a portion of the substrate prior to flipping. This may for example be achieved by means of a horizontal "cut" through the substrate to reduce the amount of material that needs to be removed in the thinning process to expose the second channel layer for subsequent processing.

It will be appreciated that the first and second channel layers extend horizontally, that is, along a main plane of extension of the substrate, and may be arranged above each other in the vertical direction, orthogonal to the main plane of extension of the substrate. Further, it will be appreciated that the first and second channel layers are arranged on the same side of the substrate. Each of the first and second channel layers may comprise one or several layers, such as nanosheets, depending on the design and configuration of the resulting transistor devices to be formed.

The term "substrate" may be understood as an underlying layer of, for instance, silicon or a dielectric material, above which the first and second channel layers are stacked.

A gate layer stack may comprise a gate dielectric, for instance, including a low-k dielectric and/or a high-k dielectric, as well as one or several conductive gate layers or metal layers.

BRIEF DESCRIPTION OF THE FIGURES

The above, as well as additional, features will be better understood through the following illustrative and non-limiting detailed description of example embodiments, with reference to the appended drawings.

FIG. 11*a* illustrates different channel layers, according to an example.

FIG. 11*b* illustrates different channel layers, according to an example.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A method for forming a first transistor structure 10 from a first channel layer 110 and a second transistor structure 20 from a second channel layer 210 will now be described with reference to FIGS. 1-10.

Figure 1:
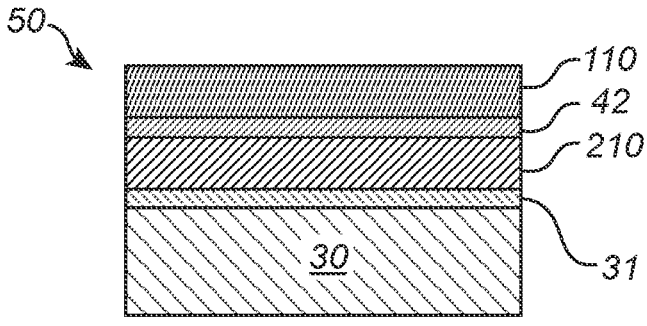
FIG. 1 illustrates a method for forming a first transistor structure from a first channel layer and a second transistor structure from a second channel layer, according to an example.

With reference to FIG. 1 there is shown a first channel layer 110 and a second channel layer 210 vertically stacked on a substrate 30. Further, a separating layer, in this case a sacrificial layer 42, may be arranged between the first and second channel layers 110, 210, forming a vertical stack 50. FIG. 1 also illustrates an etch stop layer 31 which may be arranged between the second channel layer 210 and the substrate 30. The first and second channel layers 110, 210 may be formed by means of an epitaxy process and may for instance comprise Si and/or SiGe. This may also apply to the sacrificial layer 42 separating the first and second channel layers 110, 210. Thus, the sacrificial layer 42 may comprise SiGe formed by epitaxy. As will be discussed in further detail below, the sacrificial layer 42 may comprise SiGe having a Ge content that is different from the Ge content of the first and second channel layers 110, 210. This allows the sacrificial layer 42 to be selectively etched with respect to the first and second channel layers 110, 210.

Figure 2:
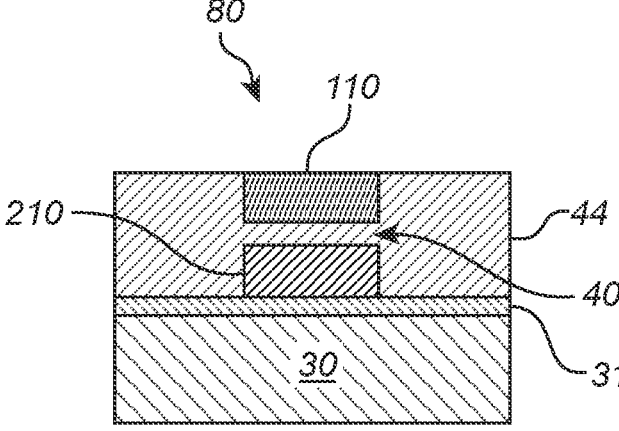
FIG. 2 illustrates a method for forming a first transistor structure from a first channel layer and a second transistor structure from a second channel layer, according to an example.

In FIG. 2, the stack 50 has been etched to form an elongated structure, such as a fin 80, of which FIG. 2 illustrates a vertical cross section taken orthogonally to the length extension of the fin 80. The fin 80 may for example be formed by etching two trenches into the stack 50. This may for example be performed using a sequence of lithography and etching steps, also referred to as a litho-etch sequence. A litho-etch sequence may generally comprise forming a photoresist mask layer on the layer which is to be patterned, i.e., the target layer. A pattern (e.g. a pattern of openings, trenches, or lines) may be lithographically defined in the photoresist layer and then transferred into the target layer by etching while using the patterned photoresist layer as an etch mask. The photoresist layer may thereafter be stripped from the target layer.

As further illustrated in FIG. 2, the sacrificial layer 42 has been removed, for instance by etching, and replaced with an STI layer 44, e.g., a dielectric material such as an oxide. The STI layer 44 may be provided both between the first and second channel layers 110, 210 (forming a separating layer 40), as well as in the trenches at the sides of the fin 80. Alternatively, the material used for the separating layer 40 may be different from the STI layer 44 deposited outside the stack, such as in the trenches. The material of the separating layer 40 may for instance be a nitride, whereas the remaining STI layer 44 may be an oxide.

The separating layer 40 may hence be formed in a replacement process, wherein an epitaxially grown (semiconductor) sacrificial layer 42 may be replaced with a dielectric material, such as a nitride. The resulting separating layer 40 may thus be considered as formed by means of an epitaxy process, although indirectly.

Figure 3:
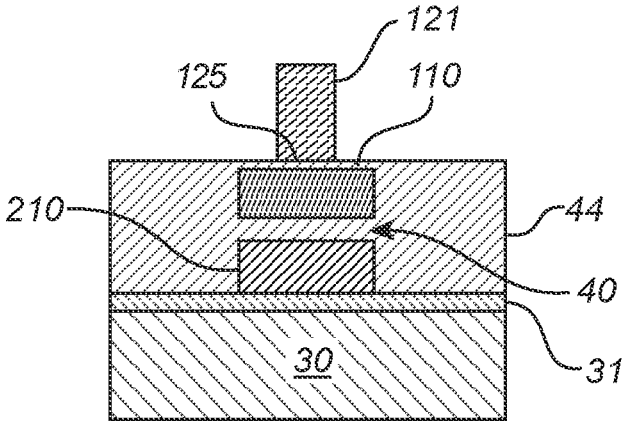
FIG. 3 illustrates a method for forming a first transistor structure from a first channel layer and a second transistor structure from a second channel layer, according to an example.

In FIG. 3, a dummy gate structure 121 has been formed on (or above) the first channel layer 110. The dummy gate structure 121 may for example be formed by depositing and patterning a silicon layer above the first channel layer 110. In the present example, the dummy gate structure 121 is provided on a dummy gate dielectric 125, which for instance may be formed of the same material as the STI layer 44.

Figure 4:
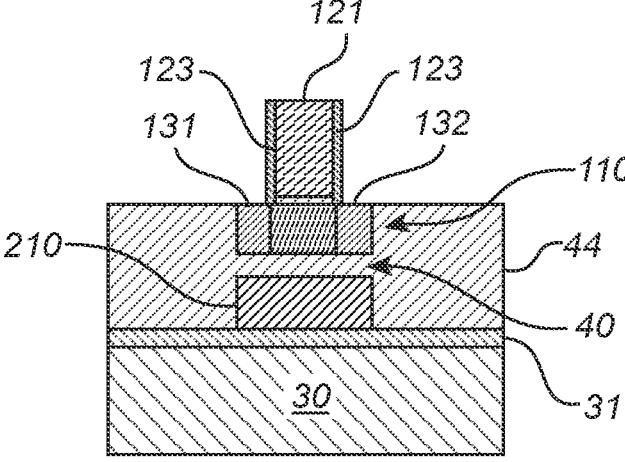
FIG. 4 illustrates a method for forming a first transistor structure from a first channel layer and a second transistor structure from a second channel layer, according to an example.

Subsequently, dummy gate spacers 123 may be formed on sidewalls of the dummy gate structure 121, as shown in FIG. 4. Further, first and second source/drain portions 131, 132 may be formed in the first channel layer 110 while the dummy gate structure 121 protects the underlying portion of the channel layer 110. The source/drain portion 131, 132 may for instance be formed by means of an epitaxy process and/or using ion implantation.

Figure 5:
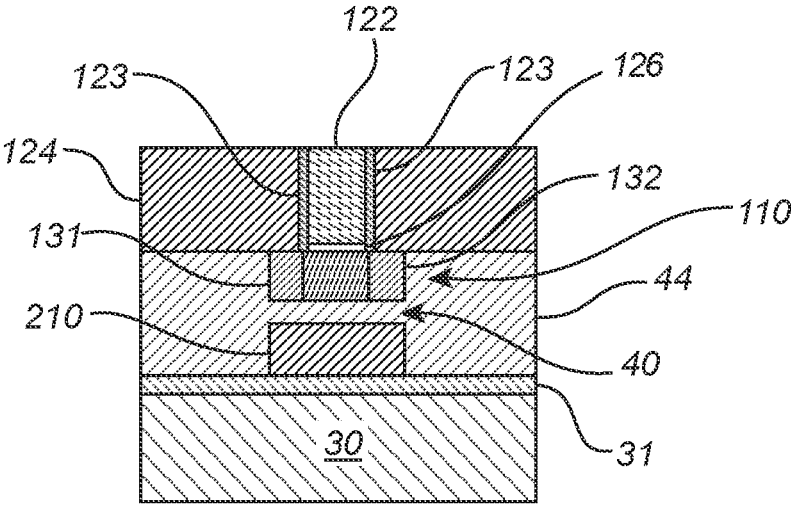
FIG. 5 illustrates a method for forming a first transistor structure from a first channel layer and a second transistor structure from a second channel layer, according to an example.

In FIG. 5, a replacement metal gate process has been performed, in which the dummy gate structure 121 and the dummy gate dielectric 125 has been replaced with a gate layer stack 122. The gate layer stack 122 may for instance comprise a gate dielectric 126, such as a low-k dielectric and/or a high-k dielectric replacing the dummy gate dielectric 125 shown in FIG. 3, as well as one or several conductive gate layers or metal layers, forming the first gate structure 120. The gate dielectric 126 may be formed of any conventional gate dielectric material such as $HfO_2$, $ZrO_2$, $Al_2O_3$. The gate dielectric material may be deposited as a conformal thin film by any conventional deposition process, for instance by ALD. The conductive gate layer(s) may be formed by an effective work function metal (EWF). P-type EWF metals may include TiN, TaN, or TiTaN, and N-type EWF metals may include Al, TiAl, TiC, or TiAlC, or compound layers such as TiN/TiAl or TiN/TaN/TiAl. The conductive gate layer(s) may be deposited by any conventional deposition process, for instance by ALD, CVD, or PVD. Further, an insulating layer, such as an interlayer dielectric (ILD) 124 may be deposited above the first channel layer 110 and embedding the first gate structure 120.

Figure 6:
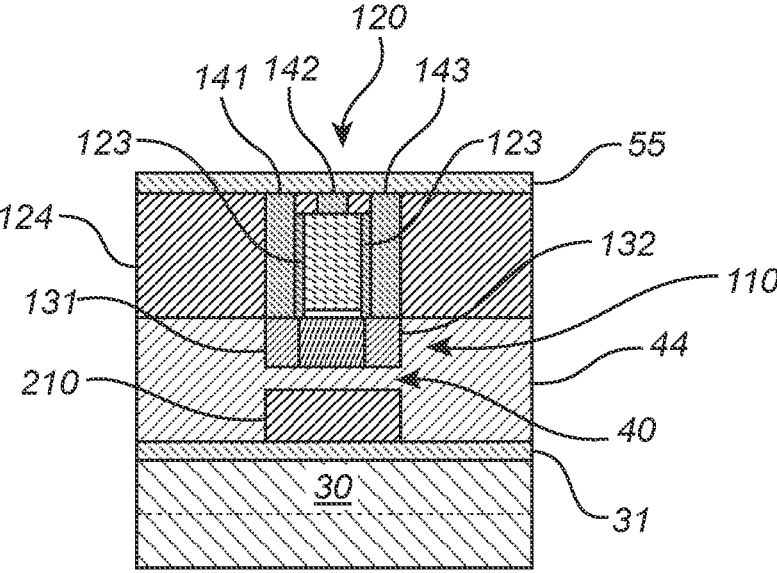
FIG. 6 illustrates a method for forming a first transistor structure from a first channel layer and a second transistor structure from a second channel layer, according to an example.

FIG. 6 shows the structure after formation of first contact structures 141, 142, 143, contacting the first gate structure 120 as well as the first and second source/drain portions 131, 132. The contact structures 141, 142, 143 may be formed in trenches extending in the ILD 124. The trenches may be etched down to the source/drain portion 131, 132 and the gate structure 120, respectively, and filled with a conductive material, such as a metal, forming contact structures 141, 142, 143 as illustrated in FIG. 6.

Further, a bonding layer 55 may formed above the ILD 124 to allow a carrier wafer to be attached to the structure of FIG. 6. As indicated in FIG. 6, at least a portion of the substrate 30 may be removed after flipping or turning the structure upside down. After flipping, the substrate 30 may be cut along a horizontal plane (indicated by a dashed line in FIG. 6) to reduce the amount of material that needs to be etched back or thinned during subsequent backside processing.

Figure 7:
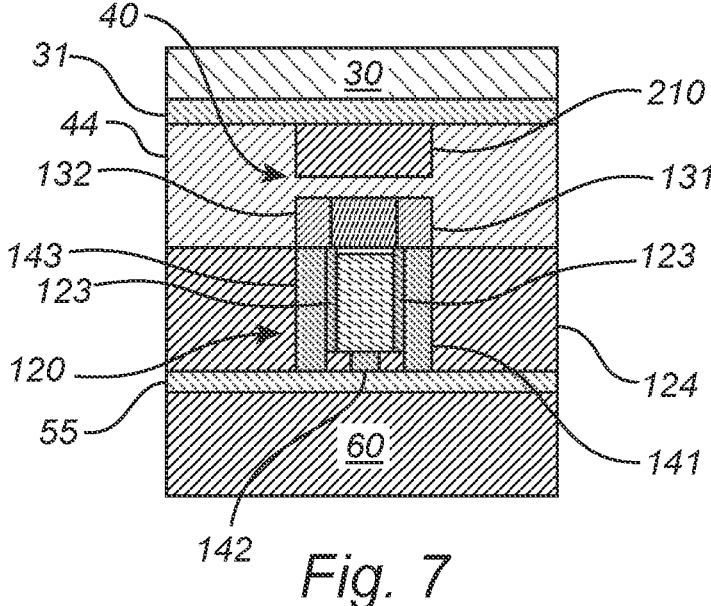
FIG. 7 illustrates a method for forming a first transistor structure from a first channel layer and a second transistor structure from a second channel layer, according to an example.

FIG. 7 shows the structure after flipping, with the cut substrate 30 arranged on the top and the carrier wafer 60, which is bonded to the bonding layer 55, arranged at the bottom of the structure. With this arrangement, the processing of the second transistor structure 20 may be continued from the (now upward facing) backside.

Figure 8:
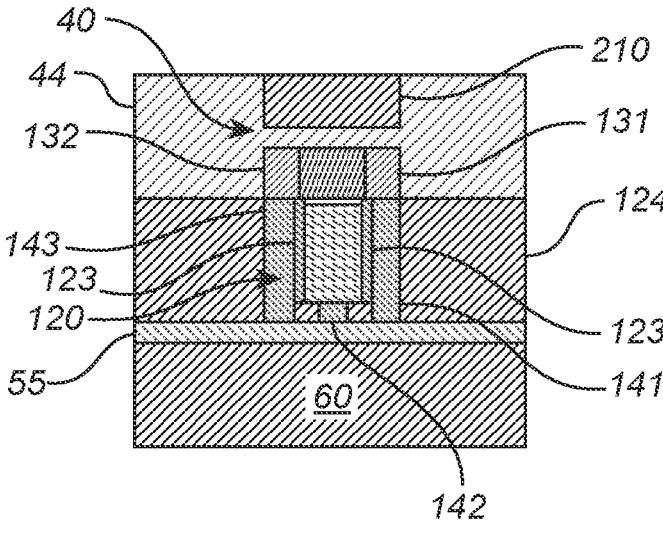
FIG. 8 illustrates a method for forming a first transistor structure from a first channel layer and a second transistor structure from a second channel layer, according to an example.

In FIG. 8, the substrate 30 has been thinned and the etch stop layer 31 removed to expose the second channel layer 210. The substrate 30 may be removed in a planarization process, for example involving etching or chemical-mechanical planarization, CMP. The second transistor structure 20 may be formed in a similar process as the first transistor structure 10. Hence, with reference to FIG. 9, a second gate structure 220, provided with spacers 223, may be formed on the second channel layer 210. The second gate structure 220 may be formed by a replacement metal gate process similar to the one outlined above in connection with the forming of the first transistor structure 10. Further, third and fourth source/drain portions 231, 232 may be formed in the second channel layer 210, with the second gate structure 220 arranged between the source/drain portions 231, 232. Additionally, the first and second gate structures 120, 220 may be connected in subsequent processing steps (not shown in FIG. 8).

Figure 9:
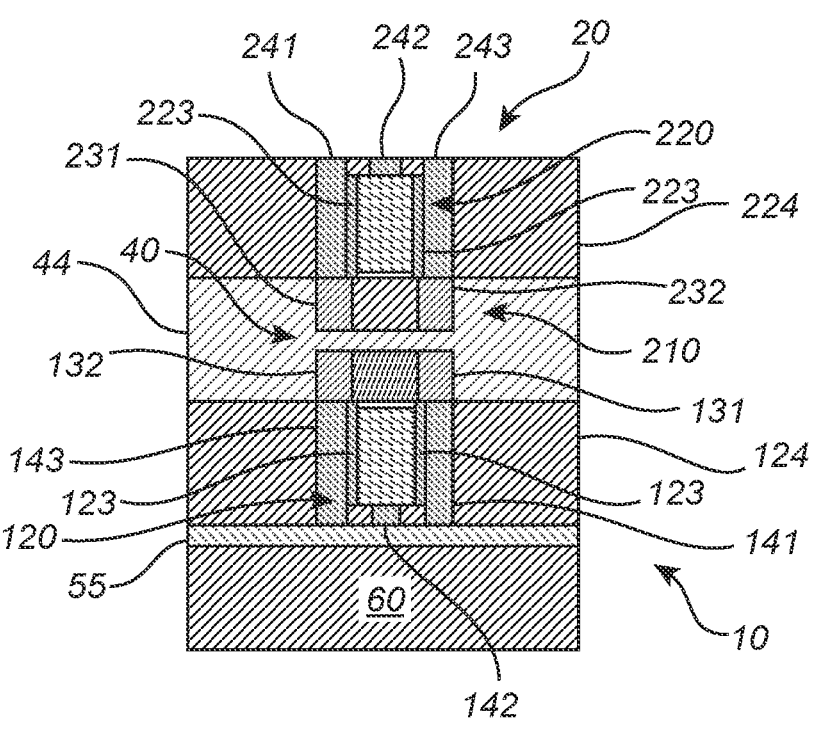
FIG. 9 illustrates a method for forming a first transistor structure from a first channel layer and a second transistor structure from a second channel layer, according to an example.

FIG. 9 hence illustrates an example of the result of the method according to an embodiment of the disclosure. A first and a second transistor structure 10, 20 are provided, which are vertically stacked such that a horizontal first channel, extending between the first and second source/drain portion 131, 132 of the first transistor structure 10, is arranged below (and self-aligned with) a horizontal second channel, extending between the third and fourth source/drain portion 231, 231 of the second transistor structure 20. The first and second transistor structures 10, 20 are separated from each other in the vertical direction by separating layer 40, which may be formed by means of an epitaxially grown sacrificial layer which later may be replaced by a dielectric material. In the present example, one of the transistor structures 10, 20 may be of an NMOS type and the other one of the transistor structures 10, 20 of a PMOS type.

Figure 10:
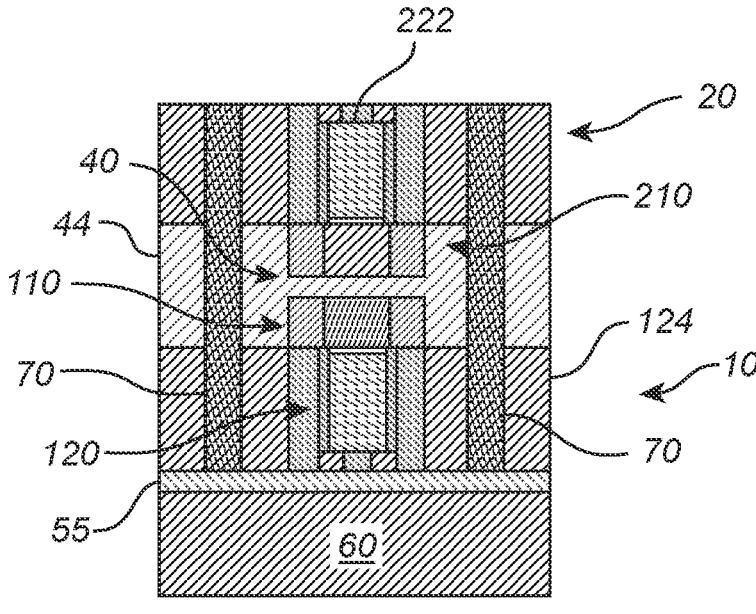
FIG. 10 illustrates a method for forming a first transistor structure from a first channel layer and a second transistor structure from a second channel layer, according to an example.

The transistor structures 10, 20 may be electrically connected by means of a vertical interconnect structure, such as high aspect ratio vias 70 as disclosed in FIG. 10. The vias 70 may thus extend through the upper and lower ILDs 224, 124 as well as through the STI layer 44 arranged therebetween. The vias 70 may be used to connect the gate structures 120, 220 of the first and second transistor structures 10, 20 as well as the source/drain portions 131, 132, 231, 232, where needed, for power delivery and signal delivery. The via 70 may be formed in a single process, in which a trench is etched all the way through the ILDs 224, 124 and the STI layer 44

The first and second channel layers 110, 210 may comprise one or several layers, such as nanosheets or nanowires, depending on the design and configuration of the resulting transistor structures 10, 20 to be formed. Three different examples will now be discussed with reference to FIGS. 11a-c.

In FIG. 11a, each of the first and second channel layers 110, 210 comprises a single device channel 111, 211, formed by a first semiconductor material such as Si. The channel layer structures may be separated by a sacrificial layer 42 of a second semiconductor material, for instance SiGe. The sacrificial layer 42 (e.g., a SiGe layer) may in subsequent processing steps be selectively removed and replaced by a dielectric material, such as an oxide, as discussed above in connection with FIGS. 1-10. Thus, FIG. 11a illustrates an example wherein a FinFET device is arranged on another FinFET device.

FIG. 11b shows another example, wherein each of the channel layers 110, 210 comprise a stack of device channels 111, 211 in the form of a plurality of nanowires. The nanowires may be formed of the first semiconductor material and stacked with alternating layers of the second semiconductor material 112, 212. Thus, FIG. 11b shows an example where a nanowire device is arranged on a nanowire device.

Figure 11C:
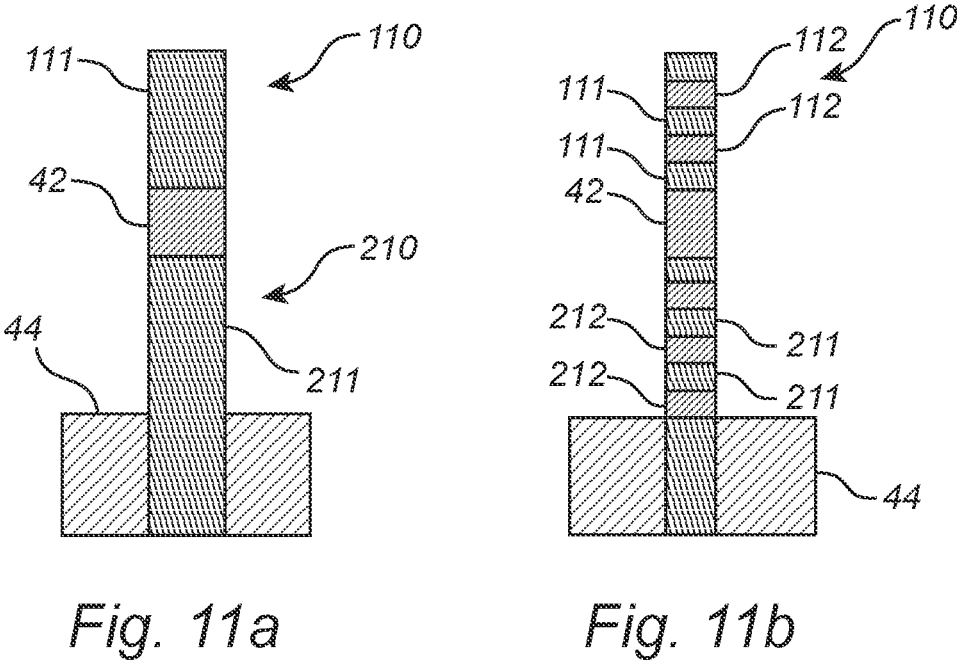
FIG. 11*c* illustrates different channel layers, according to an example.
Figure 11C:
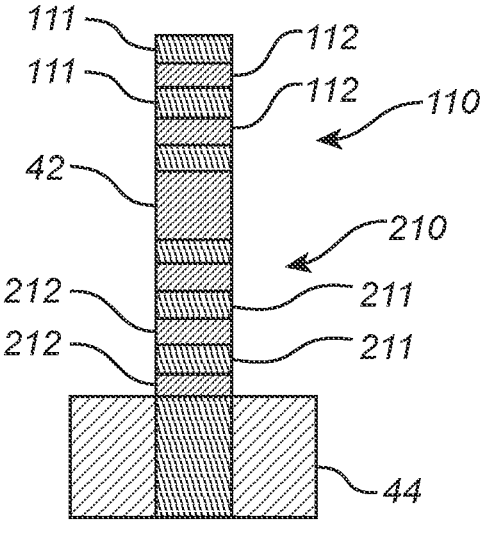

As illustrated in FIG. 11c the channel layers 110, 210 may comprise device channels 111, 211 in the form of nanosheets instead of nanowires, depending on the desired function and configuration of the resulting transistor structure. The structure in FIG. 11c may hence be a nanosheet device arranged on a nanosheet device.

However, it will be understood that other configurations are possible as well. For instance, a FinFET device may be arranged on a nanowire device or a nanosheet device. Further, a nanowire device or a nanosheet device may be arranged on a FinFET device.

The stacked structures illustrated in the examples of FIGS. 11a-c may be formed by epitaxial growth, and further be provided with the desired doping levels. Thus, the device channel(s) 111 of the first channel layer 110 may be of an N-dopant type, whereas the device channel(s) 211 of the second channel layer 210 may be of a P-dopant type, or vice versa. The resulting transistor structures 10, 20 may be vertically separated by a separating layer 40, having a thickness defined by the thickness of the epitaxially grown sacrificial layer 42 of the second semiconductor material. In some examples, the thickness of the separating layer may be 50 nm or less.

Figure 12A:
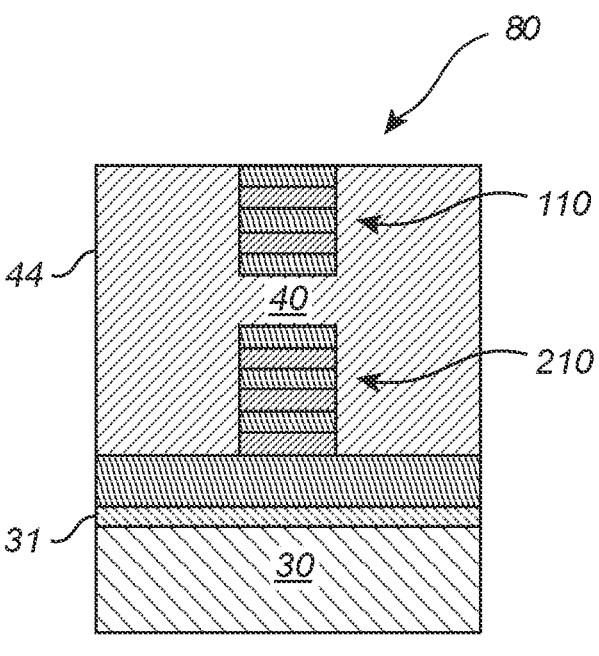
FIG. 12*a* illustrates how to separate transistor structures and/or channel layers from each other, according to an example.

An isolating layer, such as a shallow trench isolation, STI layer 44 may be provided at the sides of the fin 80, as illustrated in FIGS. 12a and b. The STI layer 44 may for example comprise an oxide, such as silicon oxide, which may be deposited after the sacrificial layer 42 between the first and second channel layers 110, 210 has been removed. Thus, the STI layer material may further fill the cavity formed after the removal of the sacrificial layer 42, as shown in FIG. 12*a*. This allows for the separating layer 40 to be formed by the same material, for example in the same filling step, as the STI layer 44. Alternatively, the separating layer 40 is formed by a material different from the STI layer 44, such as for instance a nitride. In different words, it is understood that the material of the separating layer 40 and the STI layer 44 may be the same dielectric or two different dielectrics.

Figure 12B:
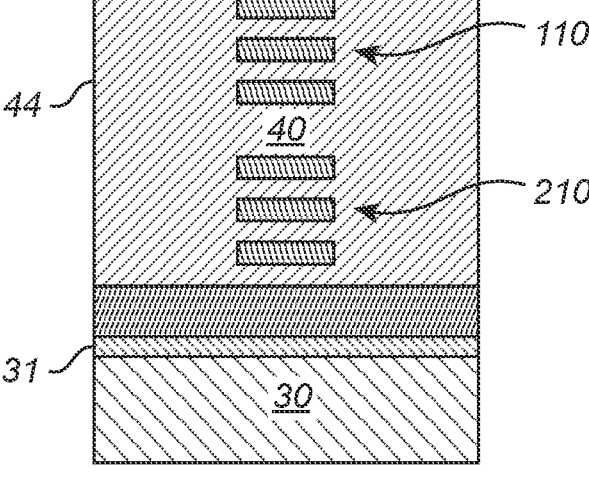
FIG. 12*b* illustrates how to separate transistor structures and/or channel layers from each other, according to an example.

In FIG. 12*b*, the material of the isolating layer 44 has been formed also between the channel layer structures of each channel layer 110, 210. This may be achieved by removing the second semiconductor material, which is arranged between each of the channel layer structures of the first and second channel layers 110, 210, at the same time the sacrificial layer 42 is etched away. Preferably, the sacrificial layer 42 and the second semiconductor material are formed of the same material, such as SiGe, having an etch selectivity with respect to the first semiconductor material from which the channel layer structures (such as e.g. nanowires or nanosheets) are formed. It will further be appreciated that stress can be induced in the channel layer structures, depending on the type of material selected for the STI layer 44.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method comprising:
   forming a first source/drain portion and a second source/drain portion in a first channel layer that is part of a stack with a second channel layer on a substrate;
   forming a first gate structure on the first channel layer, wherein the first source/drain portion and the second source/drain portion are arranged on opposite sides of the first gate structure;
   forming, above the first channel layer, first contact structures respectively contacting the first gate structure, the first source/drain portion, and the second source/drain portion;
   thinning the substrate to expose the second channel layer after forming the first contact structures;
   forming a third source/drain portion and a fourth source/drain portion in the second channel layer;
   forming a second gate structure on the second channel layer, wherein the third source/drain portion and the fourth source/drain portion are arranged on opposite sides of the second gate structure; and
   forming second contact structures respectively contacting the second gate structure, the third source/drain portion, and the fourth source/drain portion.

2. The method according to claim 1, further comprising forming a separating layer between the first channel layer and the second channel layer.

3. The method according to claim 2, wherein forming the separating layer comprises forming the separating layer via an epitaxy process.

4. The method according to claim 1, wherein the first channel layer is of an N-dopant type and the second channel layer is of a P-dopant type.

5. The method according to claim 1, wherein the second channel layer is of an N-dopant type and the first channel layer is of a P-dopant type.

6. The method according to claim 1, further comprising:
   forming, on the substrate, the stack comprising the second channel layer, a separating layer on the second channel layer, and the first channel layer on the separating layer.

7. The method of claim 6, further comprising forming a fin structure.

8. The method of claim 7, wherein forming the fin structure comprises forming the fin structure by patterning trenches in the stack.

9. The method according to claim 8, wherein forming the stack comprises forming the first channel layer and the second channel layer of a first semiconductor material, and wherein forming the separating layer comprises:
   forming a sacrificial layer of a second semiconductor material;
   removing the sacrificial layer by a selective etching of the second semiconductor material, thereby forming a cavity between the first channel layer and the second channel layer; and
   depositing an insulating material such that the trenches and the cavity are filled by the insulating material.

10. The method according to claim 9, wherein each of the first channel layer and the second channel layer comprises a plurality of layers of the first semiconductor material stacked with layers of the second semiconductor material.

11. The method of claim 10, wherein the layers of the second semiconductor material are removed by the selective etching of the second semiconductor material, thereby forming cavities underneath the layers of the first semiconductor material.

12. The method of claim 11, wherein the cavities underneath the layers of the first semiconductor material are filled by the insulating material.

13. The method according to claim 9, wherein the insulating material is an oxide.

14. The method according to claim 9, wherein each of the first channel layer and the second channel layer comprises a plurality of vertically stacked nanowires of the first semiconductor material.

15. The method according to claim 9, wherein each of the first channel layer and the second channel layer comprises a plurality of nanosheets of the first semiconductor material.

16. The method according to claim 1, wherein forming the first gate structure comprises:
   forming a dummy gate structure on the first channel layer; and
   replacing the dummy gate structure with a gate layer stack after forming the first source/drain portion and the second source/drain portion and/or the third source/drain portion and the fourth source/drain portion.

17. The method according to claim 1, further comprising:
   forming a bonding layer above the first channel layer; and
   bonding a carrier wafer to the bonding layer.

18. The method of claim 1, wherein thinning the substrate comprises thinning the substrate from a side of the substrate that is closer to the second channel layer than the first channel layer.

19. The method of claim 1, wherein forming the second gate structure comprises forming the second gate structure after forming the first contact structures.

20. A method comprising:

forming a first source/drain portion and a second source/drain portion in a first channel layer that is part of a stack with a second channel layer on a substrate;

forming a first gate structure on the first channel layer, wherein the first source/drain portion and the second source/drain portion are arranged on opposite sides of the first gate structure;

forming, above the first channel layer, first contact structures respectively contacting the first gate structure, the first source/drain portion, and the second source/drain portion;

thinning the substrate to expose the second channel layer;

forming a third source/drain portion and a fourth source/drain portion in the second channel layer;

forming a second gate structure on the second channel layer, wherein the third source/drain portion and the fourth source/drain portion are arranged on opposite sides of the second gate structure;

forming second contact structures respectively contacting the second gate structure, the third source/drain portion, and the fourth source/drain portion;

forming, on the substrate, the stack comprising the second channel layer, a separating layer on the second channel layer, and the first channel layer on the separating layer; and forming a fin structure by patterning trenches in the stack, wherein forming the stack comprises forming the first channel layer and the second channel layer of a first semiconductor material, and wherein forming the separating layer comprises:

forming a sacrificial layer of a second semiconductor material;

removing the sacrificial layer by a selective etching of the second semiconductor material, thereby forming a cavity between the first channel layer and the second channel layer; and depositing an insulating material such that the trenches and the cavity are filled by the insulating material.

* * * * *